United States Patent [19]
Nakamura

[11] Patent Number: 5,583,364
[45] Date of Patent: Dec. 10, 1996

[54] SEMICONDUCTOR DEVICE

[75] Inventor: Mitsuyoshi Nakamura, Hyogo, Japan

[73] Assignee: Mitsubishi Denki Kabushiki Kaisha, Tokyo, Japan

[21] Appl. No.: 511,500

[22] Filed: Aug. 4, 1995

Related U.S. Application Data

[63] Continuation of Ser. No. 273,166, Jul. 25, 1994, abandoned.

[30] Foreign Application Priority Data

Sep. 21, 1993 [JP] Japan ................................. 5-234769
Mar. 10, 1994 [JP] Japan ................................. 6-039496

[51] Int. Cl.⁶ ........................ H01L 29/76; H01L 29/94; H01L 31/062; H01L 31/113
[52] U.S. Cl. ..................... 257/408; 257/336; 257/344; 257/409
[58] Field of Search ................................. 257/408, 409, 257/336, 344

[56] References Cited

U.S. PATENT DOCUMENTS 4,804,637  2/1989  Smayling et al. .................. 257/408
5,327,000  7/1994  Miyata et al. ...................... 257/408

FOREIGN PATENT DOCUMENTS 61-119078  6/1986  Japan .................... 257/408
2-98938   4/1990  Japan .................... 257/408
4-112579  4/1992  Japan .................... 257/408

*Primary Examiner*—Steven H. Loke
*Attorney, Agent, or Firm*—Lowe, Price, LeBlanc & Becker

[57] ABSTRACT

A semiconductor device improved not to form a parasitic gate overlap capacitance in a drain side of an MOS transistor. A first gate electrode and a second gate electrode are provided on a semiconductor substrate. A common drain electrode is provided between first gate electrode and second gate electrode in a main surface of silicon substrate. Common drain region includes a high concentration impurity region and a pair of low concentration impurity regions. Outer edges of low concentration impurity regions are located coplanar with a side surface of gate electrodes.

1 Claim, 24 Drawing Sheets

SEMICONDUCTOR DEVICE

This application is a continuation of Application Ser. No. 08/273,166 filed Jul. 25, 1994, now abandoned.

BACKGROUND OF THE INVENTION

1. Field of the Invention

The present invention relates generally to a semiconductor device, and more particularly, to a semiconductor device improved to prevent reduction in drivability of an MOS transistor. The present invention also relates to a method of manufacturing such a semiconductor device.

2. Description of the Background Art

FIG. 30 is an enlarged view showing a transistor portion of a conventional ASIC (Application Specific Integrated Circuit).

ASIC is an LSI manufactured for a special order from a specific user. An example of the ASCI includes a gate array LSI and a full custom design LSI.

Referring to FIG. 30, the conventional ASIC is provided with a silicon substrate 1. At a main surface of silicon substrate 1 is formed a field oxide film 4 for isolating an active region from another. On the active region is provided a gate electrode 6A of a two-layer structure including a refractory metal film 7A. Refractory metal film 7A is formed of, for example, tungsten silicide. A gate insulating film 5A is provided between silicon substrate 1 and gate electrode 6A. Source/drain regions of an LDD structure are provided on both sides of gate electrode 6A in the main surface of silicon substrate 1. The source/drain region consists of a low concentration N-type impurity diffusion layer (concentration of $1\times10^{14}$ atoms/cm$^3$ or more) 9A, 9B and a high concentration N-type impurity diffusion layer (concentration of $1\times10^{16}$ atoms/cm$^3$ or more) 10A, 10B. An outer edge of low concentration N-type impurity diffusion layer 9A, 9B extends under gate electrode 6A.

An interlayer insulating film 11 is provided on silicon substrate 1 so as to cover gate electrode 6A. In interlayer insulating film 11, a contact hole 12A for exposing a portion of a surface of high concentration N-type impurity diffusion layer 10A and a contact hole 12B for exposing a portion of a surface of high concentration N-type impurity diffusion layer 10B are provided. An aluminum interconnection 13A is connected to high concentration N-type impurity diffusion layer 10A through contact hole 12A. An aluminum interconnection 13B is connected to high concentration N-type impurity diffusion layer 10B through contact hole 12B. A passivation film 14 for protecting a surface is provide on silicon substrate 1 so as to cover aluminum interconnections 13A and 13B.

A method of manufacturing a semiconductor device shown in FIG. 30 will now be described.

Referring to FIG. 31, an underlying oxide film 2 is formed on silicon substrate 1 by thermal oxidation. A nitride film 3 is formed on underlying oxide film 2 by CVD (Chemical Vapor Deposition).

Referring to FIGS. 31 and 32, nitride film 3 is patterned by photolithography so as to make an opening in a portion where the field oxide film is formed.

Referring to FIGS. 32 and 33, field oxide film 4 is formed by selectively oxidating a surface of silicon substrate 1 using a pattern of nitride film 3 as a mask. The pattern of nitride film 3 is then removed (the above-described method is referred to as LOCOS).

Referring to FIGS. 33 and 34, underlying oxide film 2 is removed.

Referring to FIG. 35, a gate oxide film 5 having a thickness in the range of 100–200 Å is formed on the surface of silicon substrate 1 by thermal oxidation.

Referring to FIG. 36, a polysilicon film 6 is formed on silicon substrate 1 by CVD. Refractory metal film 7 such as tungsten silicide is formed on polysilicon film 6 by sputtering.

Referring to FIGS. 36 and 37, polysilicon film 6 and refractory metal film 7 are patterned by photolithography to form gate electrode 6A of two-layer structure including refractory metal film 7A. Phosphorus ions are implanted to the surface of silicon substrate 1 (30–40 KeV, concentration in a range of $1\times10^{13}$–$1\times10^{14}$ atoms/cm$^2$) using gate electrode 6A as a mask, whereby an impurity layer 9 which serves as a base of the low concentration N-type impurity diffusion layer is formed.

Referring to FIG. 38, an oxide film 8 is formed on silicon substrate 1 by CVD so as to cover gate electrode 6A.

Referring to FIGS. 38 and 39, oxide film 8 is etched by anisotropic etching to form a sidewall spacer 8A on a sidewall of gate electrode 6A. Arsenic ions are implanted to the surface of silicon substrate 1 (40–50 KeV, $1\times10^{16}$ atom/cm$^2$) using gate electrode 6A and sidewall spacer 8A as a mask to form an impurity layer 10 which serves as a base of the high concentration N-type impurity diffusion layer.

Referring to FIG. 40, low concentration N-type impurity regions 9A and 9B and high concentration N-type impurity regions 10A and 10B are formed on the main surface of silicon substrate 1 by thermal treatment. Interlayer insulating film 11 is formed on silicon substrate 1 so as to cover gate electrode 6A. In interlayer insulating film 11 are formed contact hole 12A for exposing a portion of the surface of high concentration N-type impurity region 10A and contact hole 12B for exposing a portion of the surface of high concentration N-type impurity region 10B. An aluminum/silicon film 13 is formed on silicon substrate 1 by sputtering so as to be connected to high concentration N-type impurity regions 10A and 10B through contact holes 12A and 12B. Referring to FIGS. 40 and 41, aluminum interconnections 13A and 13B are formed by selectively etching aluminum/silicon film 13 by photolithography. Passivation film 14 is formed on silicon substrate 1 so as to cover aluminum interconnections 13A and 13B.

Another prior art associated with the present invention will now be described.

FIGS. 42 and 43 are cross sections of a semiconductor device disclosed in Japanese Patent Laying-Open No. 4-112579.

Referring to FIG. 42, gate electrode 6A is provided on semiconductor substrate 1. A pair of source/drain regions 10A and 10B are formed on both sides of gate electrode 6A in the surface of semiconductor substrate 1. A gate oxide film 5A is provided between semiconductor substrate 1 and gate electrode 6A. Both side portions of gate oxide film 5A are thicker than the central portion thereof.

In the semiconductor device shown in FIG. 43, one of the side portions of gate oxide film 5A is thicker than the central portion thereof.

As described above, by making thick gate oxide film 5A thick near the peak portion of hot carrier implantation, aging effect on device characteristics can be prevented, resulting in a reliable MOS transistor.

The conventional semiconductor device configured as described has the following problems. That is, referring to FIG. 30, low concentration N-type impurity regions 9A and 9B overlap gate electrode 6A. Therefore, a parasitic capacitance (hereinafter referred to as gate overlap capacitance) is formed in which gate electrode 6A is one electrode and low concentration N-type impurity region 9A (9B) is the other electrode. As a result, charge and discharge of the parasitic capacitance occur, leading to reduction in drivability of the semiconductor device.

Also in the semiconductor device shown in FIGS. 42 and 43, source/drain regions 10A and 10B overlap gate electrode 6A. Therefore, the parasitic capacitance is formed in which gate electrode 6A is one electrode and source/drain region 10A, 10B is the other electrode.

SUMMARY OF THE INVENTION

The present invention is provided to solve the above-described problems, and it is an object of the present invention to provide an improved semiconductor device capable of reducing the gate overlap capacitance.

It is another object of the present invention to provide a method of manufacturing the improved semiconductor device capable of reducing the gate overlap capacitance.

A semiconductor device in accordance with one aspect of the present invention is provided with a semiconductor substrate. A first gate electrode and a second gate electrode are provided on the semiconductor substrate so as to be parallel to each other. A first gate oxide film is provided between the semiconductor substrate and the first gate electrode. A second gate oxide film is provided between the semiconductor substrate and the second gate electrode. A common drain region is provided between the first gate electrode and the second gate electrode in a surface of the semiconductor substrate. A first source region is provided opposite to the common drain region with the first gate electrode therebetween in the surface of the semiconductor substrate. A second source region is provided opposite to the common drain region with the second gate electrode therebetween in the surface of the semiconductor substrate. The common drain region includes a high concentration impurity region extending in the direction of the first and second gate electrodes, and a pair of low concentration impurity regions provided on both sides of the high concentration impurity region. An outer edge of that one of the low concentration impurity regions which is on the side of the first gate electrode is located coplanar with a surface of a sidewall of the first gate electrode on the side of the common drain region. An outer edge of that one of the low concentration impurity regions which is on the side of the second gate electrode is located coplanar with a surface of a sidewall of the second gate electrode on the side of the common drain region.

The semiconductor device in accordance with another aspect of the present invention is provided with a semiconductor substrate. A gate electrode is provided on the semiconductor substrate. A pair of source/drain regions are provided on both sides of the gate electrode in a surface of the semiconductor substrate. An outer edge of at least one of the pair of source/drain regions is located coplanar with a surface of a sidewall of the gate electrode.

In a method of manufacturing the semiconductor device in accordance with a further aspect of the present invention, a gate insulating film including a thick film portion and first and second thin film portions thinner than the thick film portion sandwiching the thick film portion therebetween is first formed on a surface of the semiconductor substrate. On the first thin film portion is formed a first gate electrode having its one sidewall located substantially on a boundary between the thick film portion and the first thin film portion. On the second thin film portion is formed a second gate electrode having its one sidewall located substantially on a boundary between the thick film portion and the second thin film portion. Low concentration impurity ions are implanted to the surface of the semiconductor substrate, using the first gate electrode, the thick film portion of the gate oxide film and the second gate electrode as a mask. First sidewall spacers are formed on both sidewalls of the first gate electrode, and second sidewall spacers are formed on both sidewalls of the second gate electrode. The thick film portion and the thin film portions of the gate insulating films are selectively etched using the first gate electrode, the first sidewall spacers, the second gate electrode and the second sidewall spacers as a mask to partially expose the surface of the semiconductor substrate. Medium concentration impurity ions are rotary-implanted to the surface of the semiconductor substrate, using the first gate electrode, the first sidewall spacers, the second gate electrode and the second sidewall spacers as a mask. High concentration impurity ions are implanted perpendicular to the surface of the semiconductor substrate, using the first gate electrode, the first sidewall spacers, the second gate electrode and the second sidewall spacers as a mask. The implanted impurity ions are diffused in the semiconductor substrate, thereby forming (a) a common drain region provided in a region between the first gate electrode and the second gate electrode in a main surface of the semiconductor substrate, (b) a first source region provided opposite to the common drain region with the first electrode therebetween in the main surface of the semiconductor substrate, and (c) a second source region provided opposite to the common drain region with the second electrode therebetween in the main surface of the semiconductor substrate. An interlayer insulating film is formed on the semiconductor substrate so as to cover the first gate electrode and the second gate electrode. In the interlayer insulating film is formed a contact hole for exposing a surface of the first source region, the common drain region and the second source region. On the semiconductor substrate is formed an electrode interconnection connected through the contact hole to each of the first source region, the common drain region and the second source region.

In a method of manufacturing the semiconductor device in accordance with a still further aspect of the present invention, a gate insulating film including a thin film portion and a pair of thick film portions sandwiching the thin film portion therebetween is first formed on a semiconductor substrate. A gate electrode is formed on the thin film portion. An insulating film is formed on the semiconductor substrate so as to cover the gate electrode. The insulating film is anisotropically etched so as to form sidewall spacers on both sidewalls of the gate electrode and to expose the surface of the semiconductor substrate. High concentration impurity ions are implanted perpendicular to the surface of the semiconductor substrate, using the gate electrode and the sidewall spacers as a mask. Low concentration impurity ions are implanted to the surface of the semiconductor substrate by oblique rotary ion implantation, using the gate electrode and the sidewall spacers as a mask. The impurity ions implanted to the surface of the semiconductor substrate are diffused to form a pair of source/drain regions.

In the semiconductor device in accordance with the aforementioned one aspect of the present invention, since an outer edge of the common drain region does not extend under the first and second gate electrodes, parasitic capacitance will not be formed.

In the semiconductor device in accordance with the aforementioned another aspect of the present invention, since an outer edge of at least one of the pair of source/drain regions does not extend under the gate electrode, parasitic capacitance will not be formed in at least one of the pair of source/drain regions.

In the method of manufacturing the semiconductor device in accordance with the aforementioned further aspect of the present invention, a low concentration portion of the common drain region is formed by rotary ion implantation. It is also possible to implant ions perpendicular to the substrate. However, the method to implant ions perpendicular to the substrate requires lithography process. If the rotary ion implantation is used, such a lithography process can be avoided, resulting in the improvement in throughput.

In the method of manufacturing the semiconductor device in accordance with the aforementioned still further aspect of the present invention, since low concentration impurity ions are implanted to the surface of the semiconductor substrate by oblique rotary ion implantation using the gate electrode and the sidewall spacers as a mask, a low concentration impurity ion region in a source/drain region can be formed so as not to overlap a gate electrode by adjusting an implantation angle.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

Embodiment 1

Figure 1:
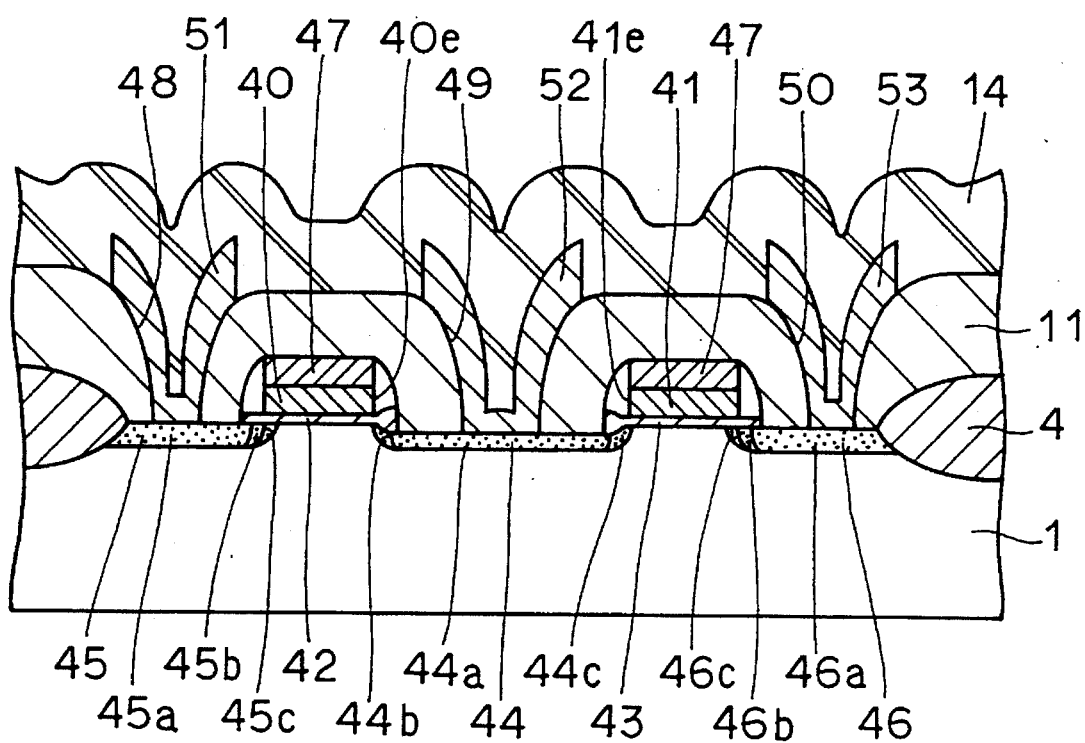
FIG. 1 is a sectional view of a semiconductor device in accordance with one embodiment of the present invention.
Figure 2:
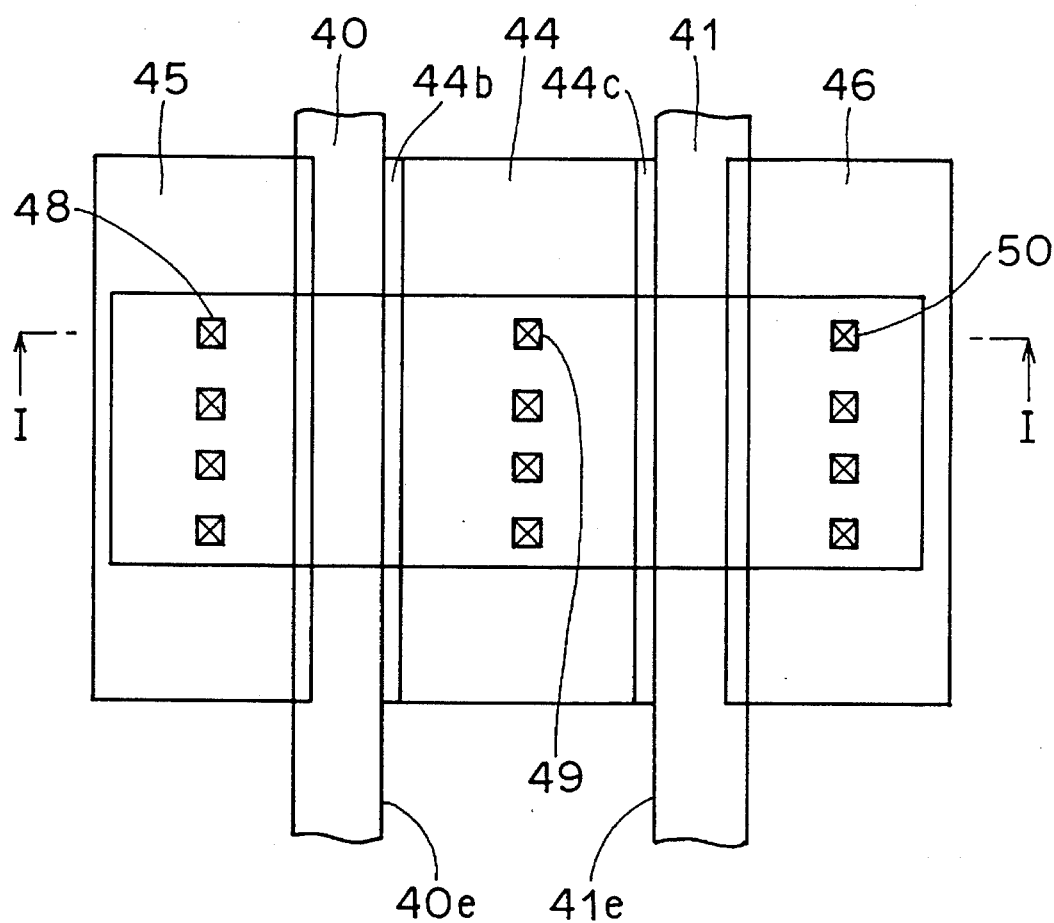
FIG. 2 is a plan view of the semiconductor device shown in FIG. 1.

FIG. 1 is a sectional view of a semiconductor device according to one embodiment of the present invention, and FIG. 2 is a plan view thereof. FIG. 1 is a sectional view taken along line I—I of FIG. 2.

Referring to FIG. 1, a field oxide film 4 for isolating an active region from another is formed at a main surface of a silicon substrate 1. A first gate electrode 40 and a second gate electrode 41 are provided on the active region so as to be parallel to each other. Each of first gate electrode 40 and second gate electrode 41 forms a two-layer structure including a refractory metal film 47 such as tungsten silicide. A first gate oxide film 42 is provided between silicon substrate 1 and first gate electrode 40. A second gate oxide film 43 is provided between silicon substrate 1 and second gate electrode 41. A common drain region 44 is provided between first gate electrode 40 and second gate electrode 41 in a surface of the active region. A first source region 45 is provided opposite to common drain region 44 with first gate electrode 40 therebetween in the surface of the active region. A second source region 46 is provided opposite to common drain region 44 with second gate electrode 41 therebetween in the surface of the active region.

Common drain region 44 includes a high concentration impurity region 44a (concentration of $1 \times 10^{16}$ atom/cm$^3$ or more) extending in the same direction as first and second gate electrodes 40 and 41, and a pair of low concentration impurity regions 44b and 44c (concentration of $1 \times 10^{15}$ atom/cm$^3$ or more) provided on both sides of high concentration impurity region 44a. An outer edge of low concentration impurity region 44b on the side of first gate electrode 40 is located coplanar with a surface of a sidewall 40e on the side of common drain region 44, and an outer edge of low concentration impurity region 44c on the side of second gate electrode 41 is located coplanar with a surface of a sidewall 41e on the side of common drain region 44.

First source region 45 includes a first high concentration impurity region 45a (concentration of $1 \times 10^{16}$ atom/cm$^3$ or more), a medium concentration impurity region 45b (concentration of $1 \times 10^{15}$ atom/cm$^3$ or more) and a first low concentration impurity region 45c (concentration of $1 \times 10^{14}$ atom/cm$^3$ or more). First high concentration impurity region 45a extends in the same direction as first gate electrode 40, and is provided in the most distant position from first gate electrode 40. First medium concentration impurity region 45b extends in the same direction as first gate electrode 40, and is provided adjacent to first high concentration impurity region 45a. Impurity concentration in first medium concentration impurity region 45b is lower than that in first high concentration impurity region 45a. First low concentration impurity region 45c extends in the same direction as first gate electrode 40, and is provided adjacent to first medium concentration impurity region 45b and nearest to first gate electrode 40. Impurity concentration in first low concentration impurity region 45c is lower than that in first medium concentration impurity region 45b. An outer edge of first low concentration impurity region 45c extends under first gate electrode 40. Thus, faster operation of a transistor can be realized.

Second source region 46 includes a second high concentration impurity region 46a (concentration of $1\times10^{16}$ atom/cm$^3$ or more), a second medium concentration impurity region 46b (concentration of $1\times10^{15}$ atom/cm$^3$ or more) and a second low concentration impurity region 46c (concentration of $1\times10^{14}$ atom/cm$^3$ or more). Second high concentration impurity region 46a extends in the same direction as second gate electrode 41, and is provided in the most distant position from second gate electrode 41. Second medium concentration impurity region 46b extends in the same direction as second gate electrode 41, and is provided adjacent to second high concentration impurity region 46a. Impurity concentration in second medium concentration impurity region 46b is lower than that in second high concentration impurity region 46a. Second low concentration impurity region 46c extends in the same direction as second gate electrode 41, and is provided adjacent to second medium concentration impurity region 46b and nearest to second gate electrode 41. Impurity concentration in second low concentration impurity region 46c is lower than that in second medium concentration impurity region 46b. An outer edge of second low concentration impurity region 46c extends under second gate electrode 41. Thus, faster operation of a transistor can be realized.

Each of first gate electrode 40 and second gate electrode 41 forms a two-layer structure including refractory metal film 47 such as tungsten silicide. An interlayer insulating film 11 is provided on silicon substrate 1 so as to cover first gate electrode 40 and second gate electrode 41. In interlayer insulating film 11, a contact hole 48 for exposing a portion of first source region 45 and a contact hole 49 for exposing a portion of a surface of common drain region 44, and a contact hole 50 for exposing a portion of a surface of second source region 46 are formed. An aluminum interconnection 51 is connected through contact hole 48 to first source region 45, an aluminum interconnection 52 is connected through contact hole 49 to common drain region 44, and an aluminum interconnection 53 is connected through contact hole 50 to second source region 46. A passivation film 14 is provided on silicon substrate 1 so as to cover aluminum interconnections 51, 52 and 53.

In an apparatus in accordance with the embodiment, since an outer edge of low concentration impurity region 44b on the side of first gate electrode 40 is located coplanar with the surface of sidewall 40e, which is on the side of common drain region 44, of first gate electrode 40, parasitic capacitance will not be formed between first gate electrode 40 and low concentration impurity region 44b.

In addition, since an outer edge of low concentration impurity region 44c on the side of second gate electrode 41 is located coplanar with the surface of sidewall 41e, which is on the side of the common drain region, of second gate electrode 41, parasitic capacitance will not be formed between second gate electrode 41 and low concentration impurity region 44c.

Embodiment 2

A method of manufacturing a semiconductor device shown in FIG. 1 will now be described.

Figure 3:
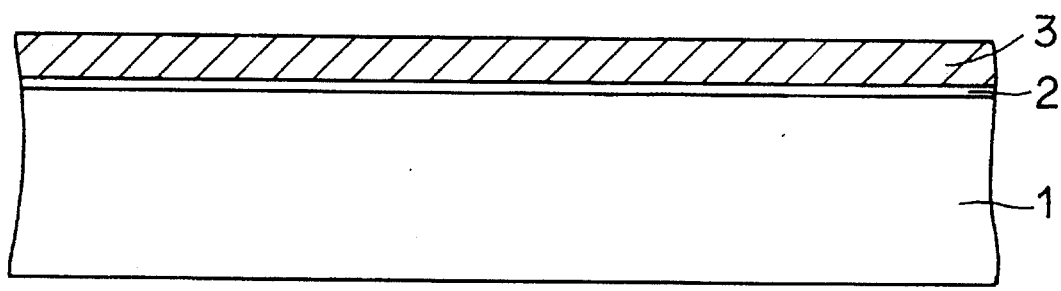
FIGS. 3–7 are partial sectional views of the semiconductor device showing first to fifth steps of a method of manufacturing the semiconductor device shown in FIG. 1, respectively.

Referring to FIG. 3, an underlying oxide film 2 is formed on silicon substrate 1. A nitride film 3 is formed on underlying oxide film 2.

Figure 4:
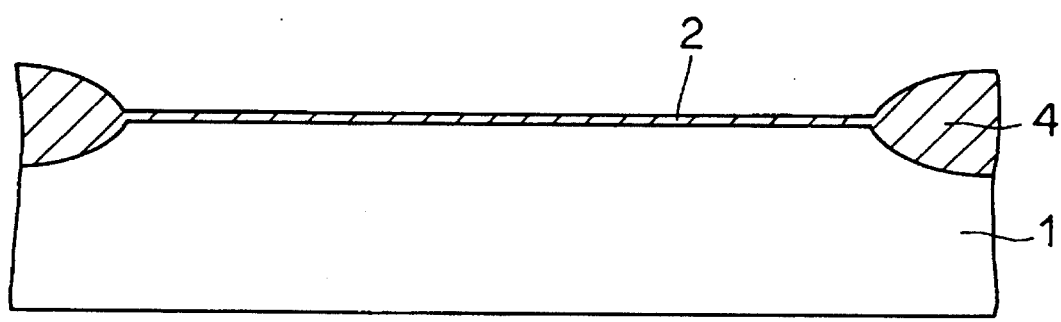
Figure 22:
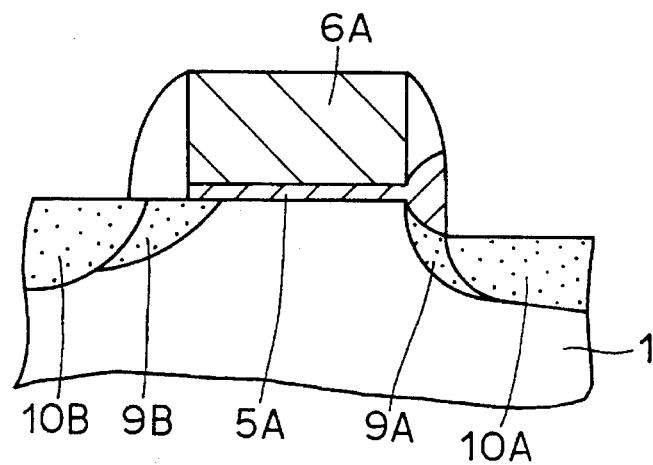
FIG. 22 is a sectional view of a semiconductor device according to still further embodiment of the present invention.
Figure 23:
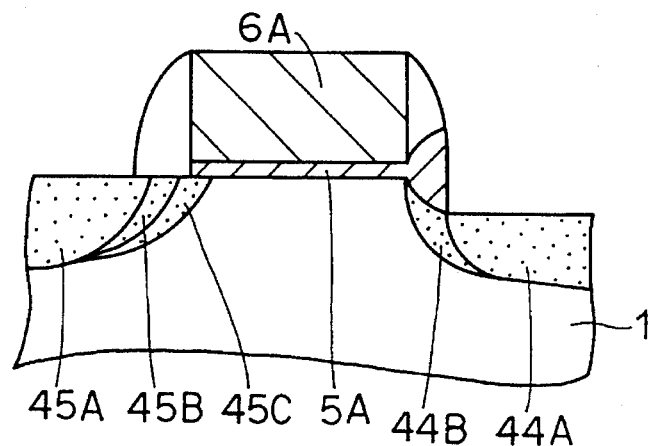
FIG. 23 is a sectional view of a semiconductor device according to still further embodiment of the present invention.
Figure 24:
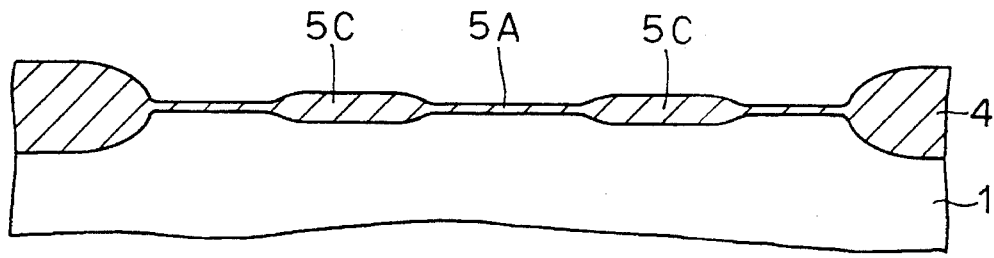
FIGS. 24–29 are sectional views of a semiconductor device showing first to sixth steps of a method of manufacturing the semiconductor device shown in FIG. 21, respectively.

Referring to FIGS. 3 and 4, a field oxide film 4 is formed on a main surface of silicon substrate 1 by the conventional LOCOS shown in FIGS. 22–24.

Figure 5:
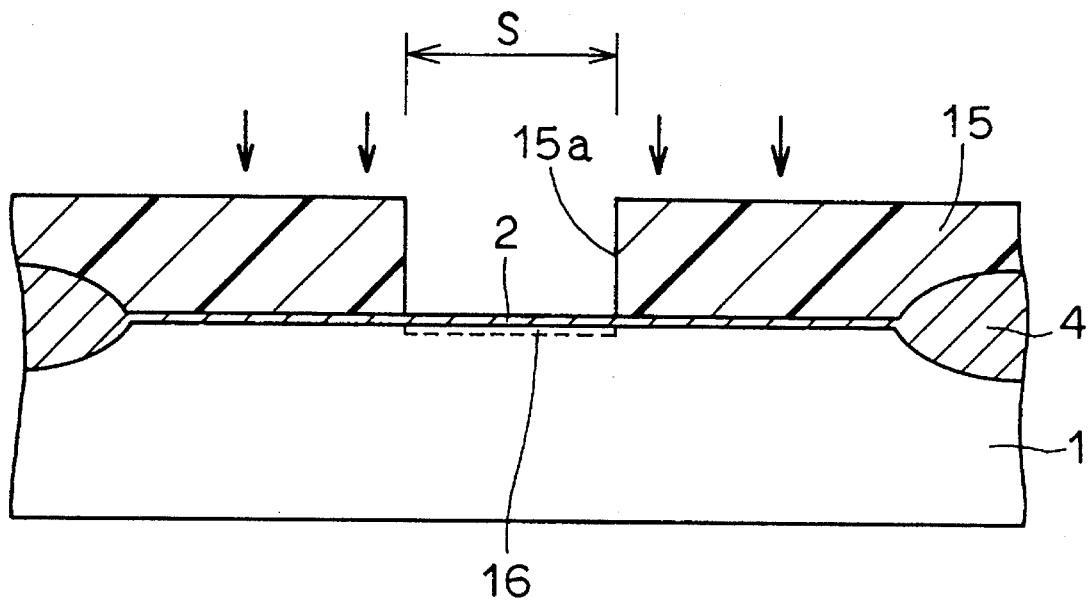
Figure 6:
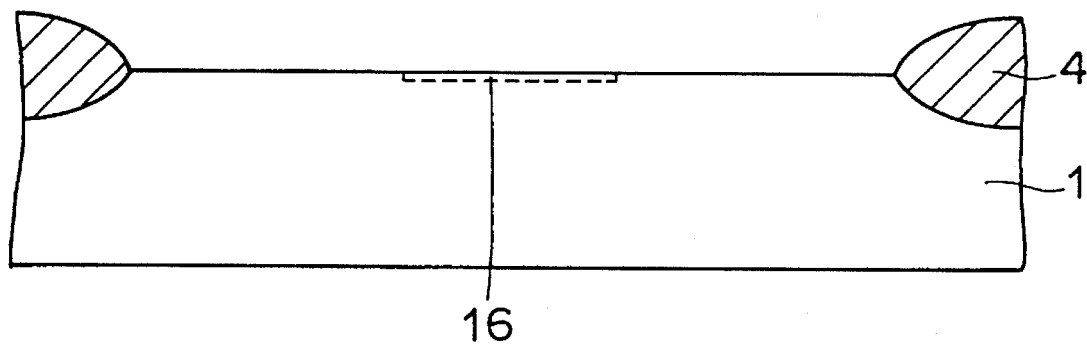

Referring to FIG. 5, a resist pattern 15 having an aperture 15a in a place sandwiched between a first gate electrode and a second gate electrode, both of which will be formed later, is formed on silicon substrate 1. In the figure, a reference character S indicates a distance between the first gate electrode and the second gate electrode which will be formed later. Arsenic ions or phosphorus ions are implanted to a surface of silicon substrate 1 through underlying oxide film 2 using resist pattern 15 as a mask ($1\times10^{13}$–$1\times10^{14}$ atoms/cm$^2$, 10–30 KeV). Thus, an implanted region 16 is formed on the surface of silicon substrate 1. Referring to FIGS. 5 and 6, resist pattern 15 is removed, and underlying oxide film 2 is removed thereafter.

Figure 7:
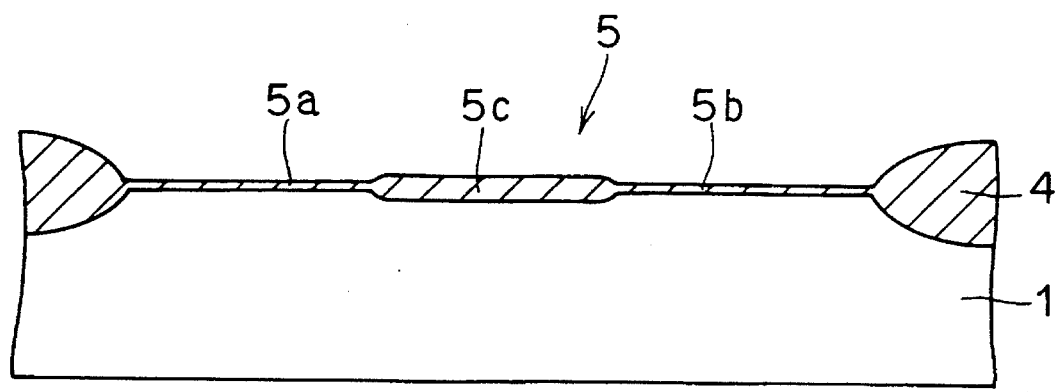
Figure 8:
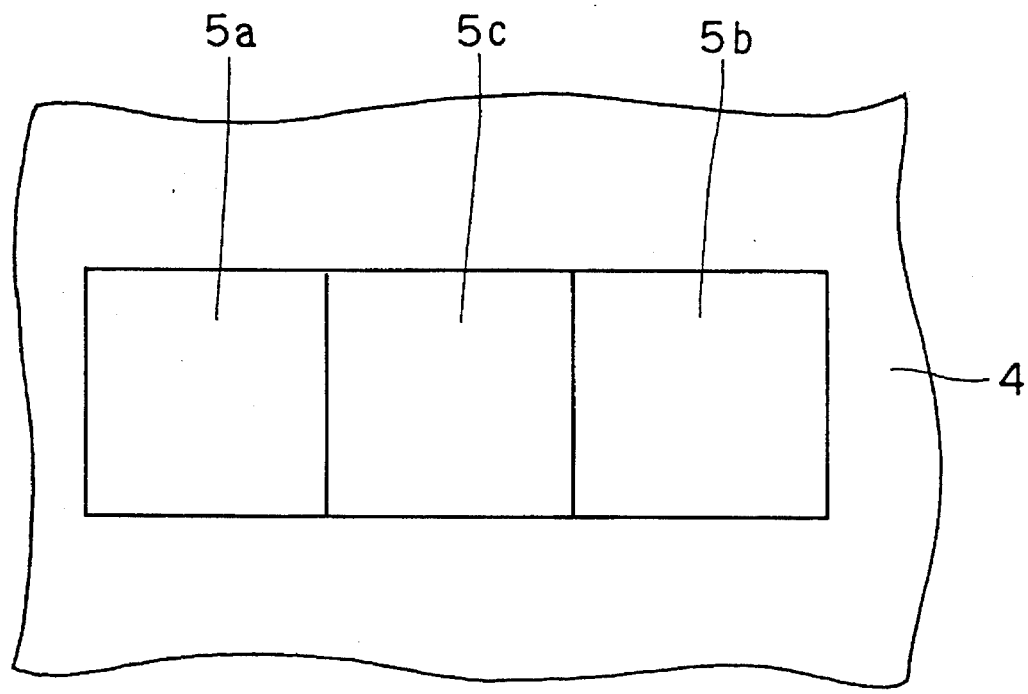
FIG. 8 is a plan view of the semiconductor device shown in FIG. 7.

Referring to FIGS. 6 and 7, by performing thermal oxidation to silicon substrate 1, a gate insulating film 5 is formed on an active region, including a thick film portion 5c, and a first thin film portion 5a and a second thin film portion 5b both of which are thinner than thick film portion 5c. First and second thin film portions 5a and 5b have a thickness of, for example, 200 Å and thick film portion 5c has a thickness of, for example, 400 Å. FIG. 8 is a plan view of FIG. 7.

Figure 9:
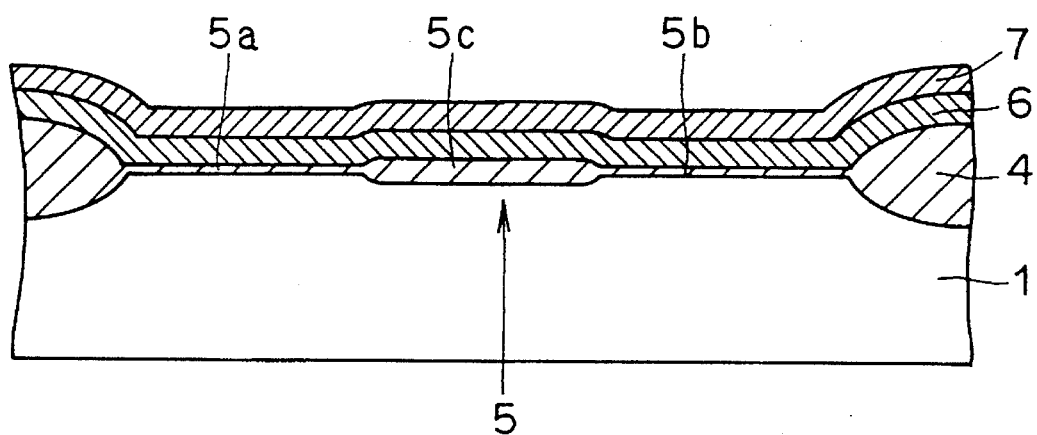
FIGS. 9–16 are partial sectional views of the semiconductor device showing sixth to thirteenth steps of a method of manufacturing the semiconductor device shown in FIG. 1, respectively.

Referring to FIG. 9, a polysilicon film 6 is formed by CVD so as to cover field oxide film 4 and gate oxide film 5. A refractory metal film 7 such as tungsten silicide is formed on polysilicon film 6 by sputtering.

Figure 10:
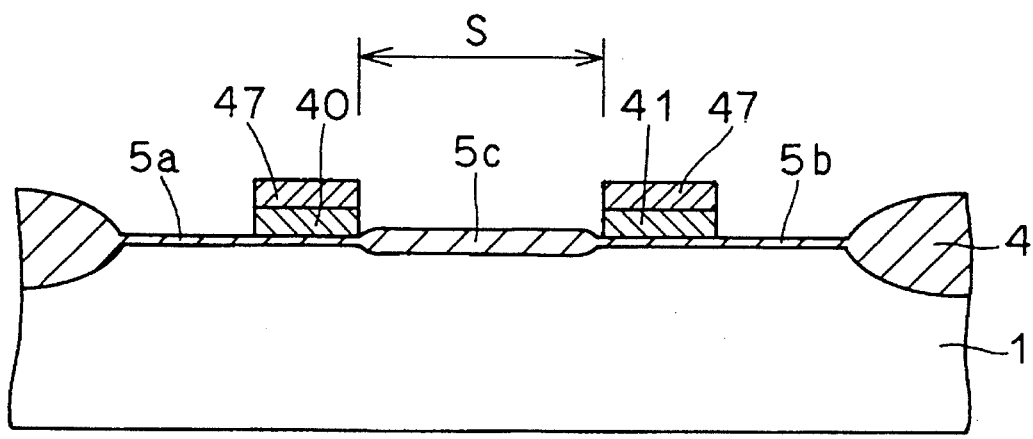

Referring to FIGS. 9 and 10, refractory metal film 7 and polysilicon film 6 are patterned using photolithography, thereby forming, on first thin film portion 5a, first gate electrode 40 having its one sidewall located substantially on a boundary between thick film portion 5c and first thin film portion 5a and, on second thin film portion 5b, second gate electrode 41 having its one sidewall located substantially on a boundary between thick film portion 5c and second thin film portion 5b. Each of first gate electrode 40 and second gate electrode 41 forms a two-layer structure including refractory metal film 47.

Figure 11:
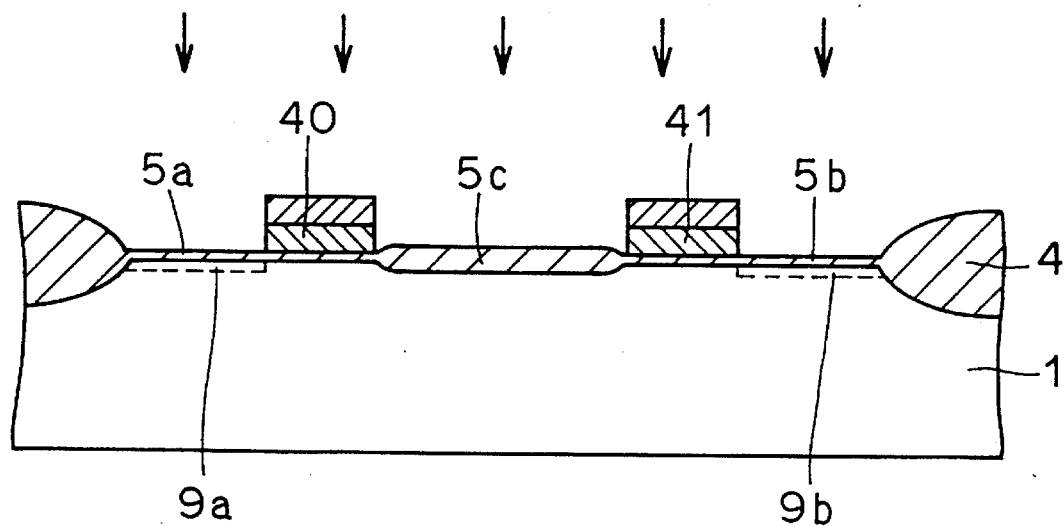

Referring to FIG. 11, phosphorus ions are implanted to the surface of silicon substrate 1 using first gate electrode 40, second gate electrode 41 and thick film portion 5c of the gate oxide film as a mask (30–40 KeV, $1\times10^{13}$–$1\times10^{14}$ atoms/cm$^2$) to form an implanted layer 9a which serves as a base of the first low concentration impurity region of the first source region and an implanted region 9b which serves as a base of the second low concentration impurity region of the second source region. At this time, phosphorus ions are not implanted under thick film portion 5c.

Figure 12:
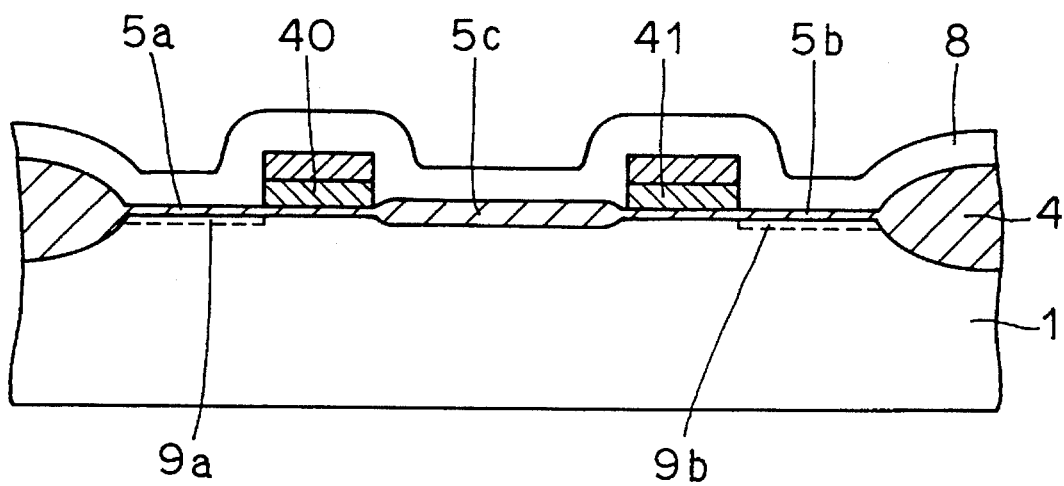

Referring to FIG. 12, an oxide film 8 is formed by CVD so as to cover first gate electrode 40 and second gate electrode 41.

Figure 13:
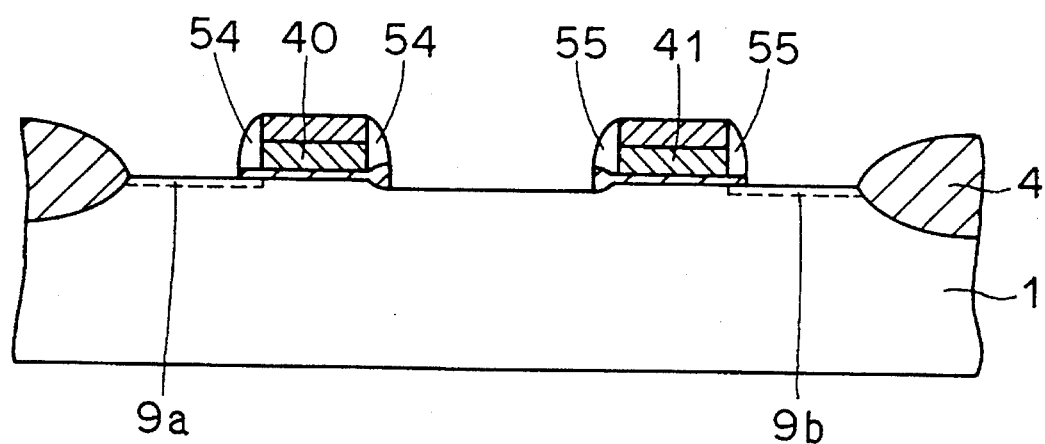

Referring to FIGS. 12 and 13, by performing anisotropic etching to oxide film 8, first sidewall spacers 54 are formed on both sidewalls of first gate electrode 40, and second sidewall spacers 55 are formed on both sidewalls of second gate electrode 41. At the same time, thick film portion 5c of the gate insulating film is etched to expose the surface of silicon substrate 1.

Figure 14:
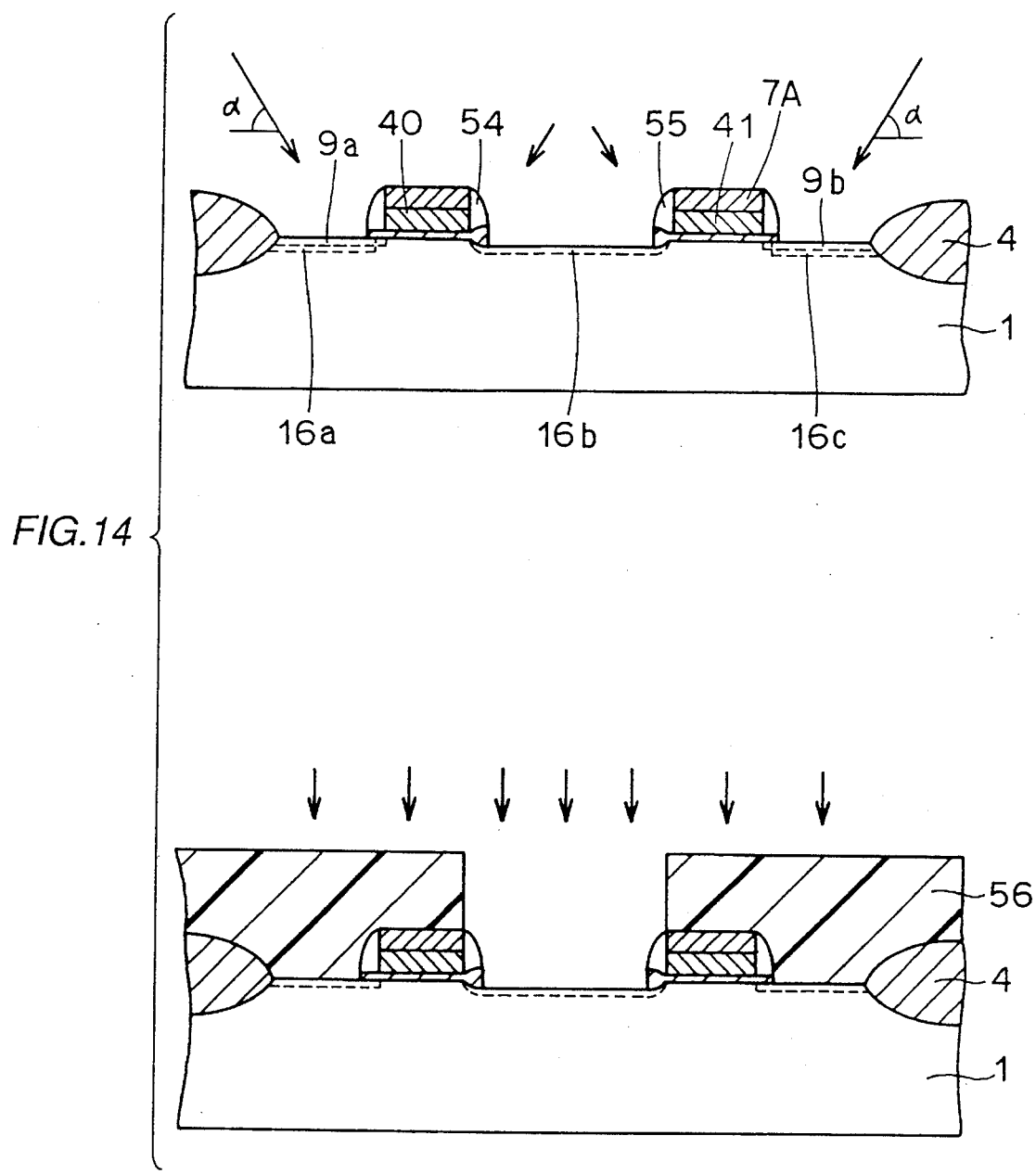

Referring to FIG. 14(A), phosphorus ions are implanted by oblique rotary ion implantation, using first gate electrode 40, second gate electrode 41, first sidewall spacers 54 and second sidewall spacers 55 as a mask (50–100 KeV, $1\times10^{13}$–$1\times10^{14}$ atoms/cm$^2$). An implantation angle α is in the range of 30°–45°. By performing this rotary ion implantation, an implanted layer 16a which serves as a base of the medium concentration impurity region of the first source region, an implanted layer 16b which serves as a base of the low concentration impurity region of the common drain region, and an implanted layer 16c which serves as a base of the medium concentration impurity region of the second source region are formed.

In the case where the oblique rotary ion implantation shown in FIG. 14(A) is not performed, it is necessary to form a resist pattern 56 and implant impurities using resist pattern 56 as a mask, as shown in FIG. 14(B). If the oblique rotary ion implantation shown in FIG. 14(A) is used, a step of forming a resist pattern will not be necessary, and the required number of times to perform lithography processes is reduced by one, resulting in the improvement in throughput.

Figure 15:
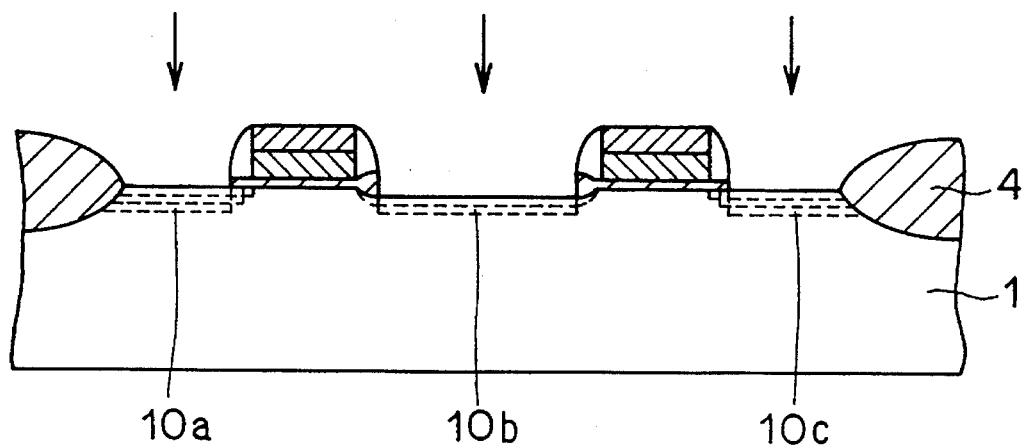

Referring to FIG. 15, arsenic ions are implanted to the surface of silicon substrate 1 (40–50 KeV, $1\times10^{15}$–$1\times10^{16}$ atoms/cm$^2$) to form an implanted layer 10a which serves as a base of the high concentration impurity region of the first source region, an implanted layer 10b which serves as a base of the high concentration impurity region of the common drain region, and an implanted layer 10c which serves as a base of the high concentration impurity region of the second source region.

Figure 16:
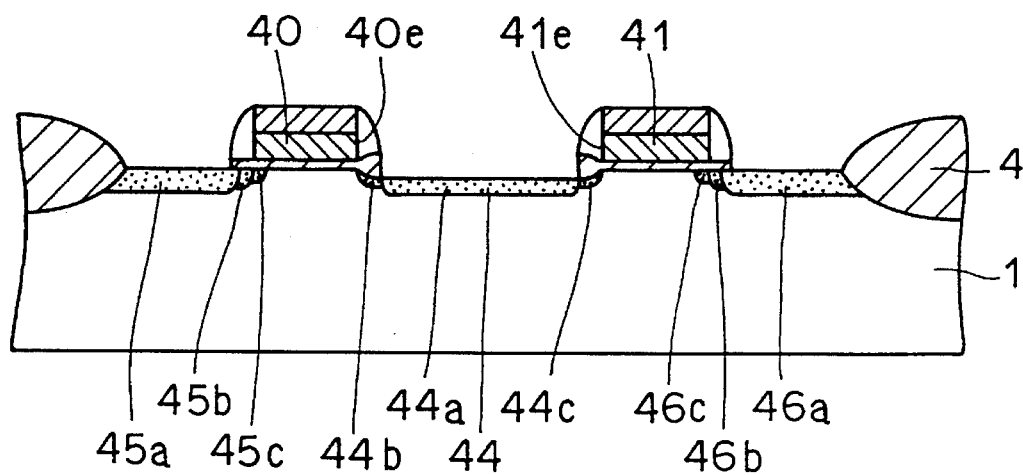

Referring to FIG. 16, by performing thermal treatment to silicon substrate 1, implanted impurity ions are diffused to form first high concentration impurity region 45a, first medium concentration impurity region 45b and first low concentration impurity region 45c of the first source region, high concentration impurity region 44a and low concentration impurity region 44b of common drain region 44, and second high concentration impurity region 46a, second medium concentration impurity region 46b and second low concentration impurity region 46c of the second source region.

By selecting the implantation angle of the rotary ion implantation to be in the above-described range, an outer edge of low concentration impurity region 44b of the common drain region is located coplanar with the surface of sidewall 40e, which is on the side of common drain region 44, of first gate electrode 40, and an outer edge of low concentration impurity region 44c on the side of second gate electrode 41 is located coplanar with the surface of sidewall 41e, which is on the side of common drain region 44, of second gate electrode 41.

Figure 17:
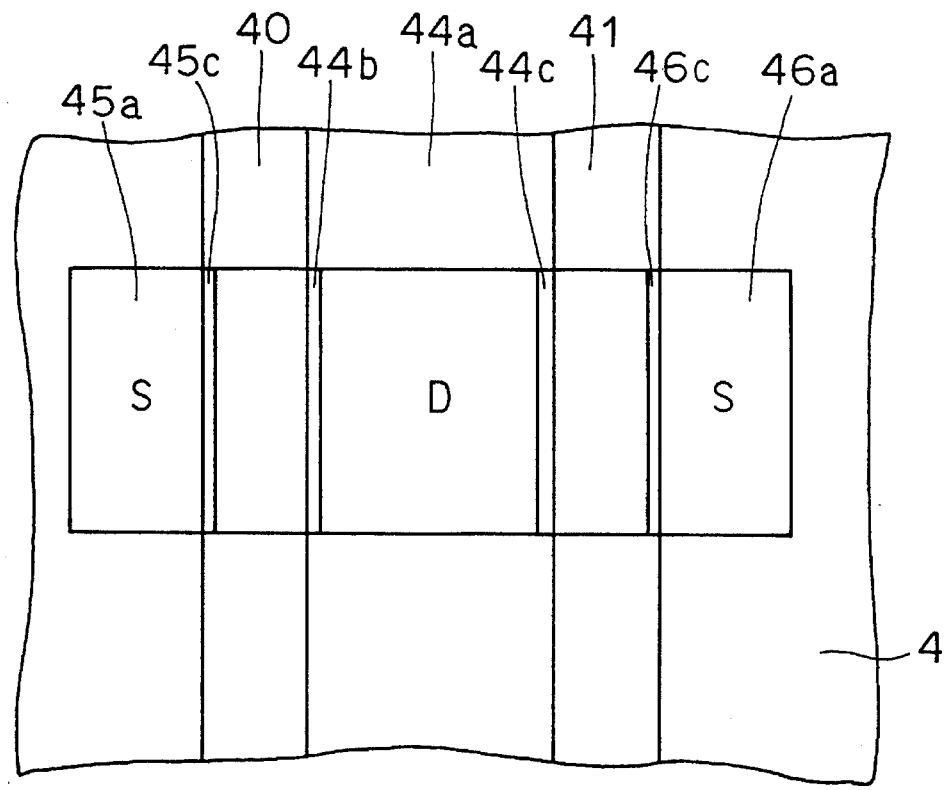
FIG. 17 is a plan view of the semiconductor device shown in FIG. 16.

FIG. 17 is a plan view of a semiconductor device shown in FIG. 16.

Figure 18:
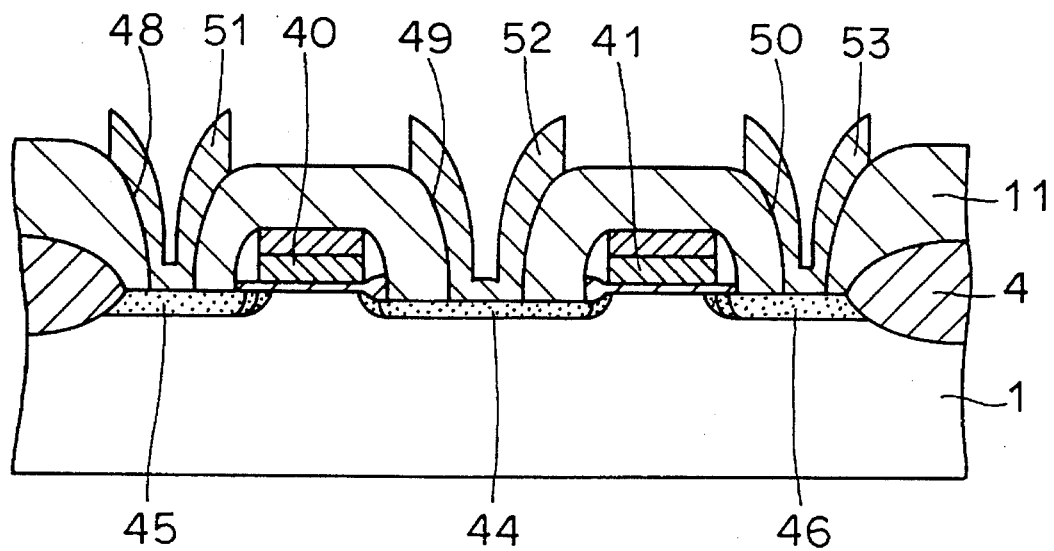
FIGS. 18 and 19 are partial sectional views of the semiconductor device showing fourteenth and fifteenth steps of a method of manufacturing the semiconductor device shown FIG. 1, respectively.

Referring to FIG. 18, interlayer insulating film 11 is formed on silicon substrate 1 so as to cover first gate electrode 40 and second gate electrode 41. In interlayer insulating film 11 are formed contact holes 48, 49 and 50 for exposing a portion of a surface of first source region 45, common drain region 44 and second source region 46, respectively. Aluminum interconnections 51, 52 and 53 are formed on silicon substrate 1, which are connected through contact holes 48, 49 and 50 to first source region 45, common drain region 44 and second source region 46, respectively.

Figure 19:
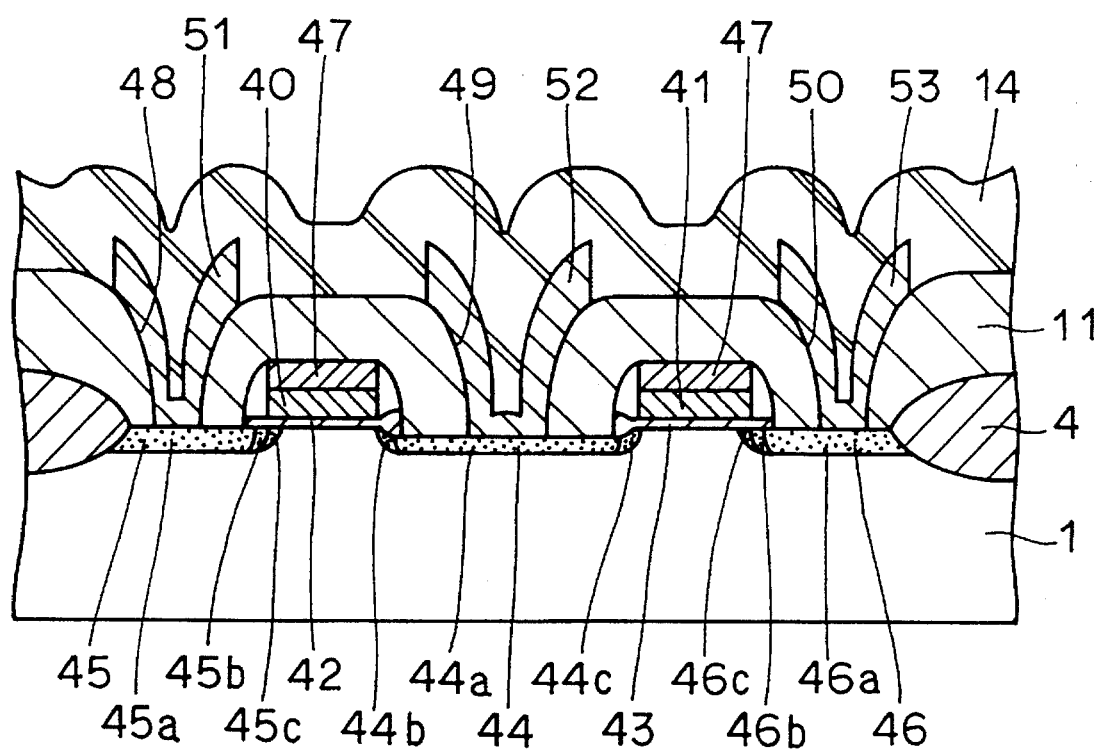

After that, referring to FIG. 19, passivation film 14 is formed on a whole surface of silicon substrate 1, whereby a semiconductor device is completed.

Although the above-described embodiments are related to an N-channel MOS transistor, the present invention is not limited to this, and the same effect can be obtained also for a P-channel MOS transistor.

Embodiment 3

Figure 20:
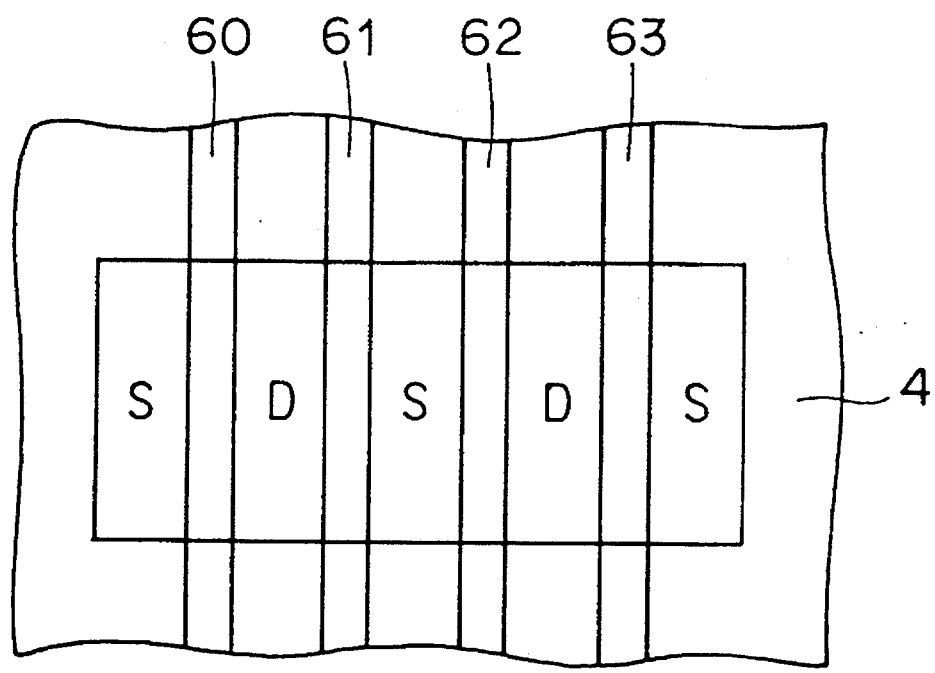
FIG. 20 is a plan view of a semiconductor device according to another embodiment of the present invention.

Although the above-described embodiments are related to the case where two gate electrodes are located in the active region of silicon substrate 1, the present invention is not limited to this, and the same effect can be obtained, even if more than four gate electrodes 60, 61, 62 and 63 are located in the active region of silicon substrate 1, as shown in FIG. 20.

Embodiment 4

Figure 21:
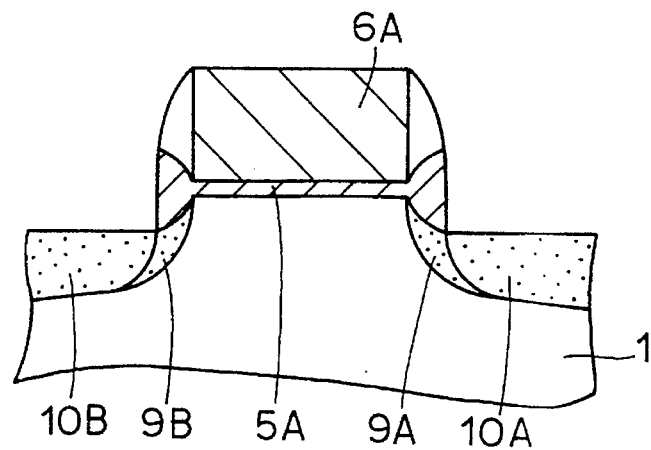
FIG. 21 is a sectional view of a semiconductor device according to further embodiment of the present invention.

Although the above-described embodiments are related, by way of example, to the case where a plurality of gate electrodes are provided in the active region, a single gate electrode may be provided as shown in FIGS. 21–23.

Referring to FIG. 21, a gate electrode 6A is provided on semiconductor substrate 1. A gate insulating film 5A is provided between gate electrode 6A and semiconductor substrate 1. A pair of source/drain regions are provided on both sides of gate electrode 6A in a surface of semiconductor substrate 1. One of the pair of source/drain regions has an LDD structure consisting of a high concentration impurity region 10A and a low concentration impurity region 9A connected to high concentration impurity region 10A. The LDD structure can reduce a drain field. The other source/drain region has the LDD structure consisting of a high concentration impurity region 10B and a low concentration impurity region 9B connected to high concentration impurity region 10B. Both side portions of a gate insulating film 5A are thicker than the central portion thereof. Outer edges of low concentration impurity regions 9A and 9B are located coplanar with surfaces of sidewalls of gate electrode 6A, respectively. Since the outer edges of low concentration impurity regions 9A and 9B do not extend under gate electrode 6A, parasitic capacitance will not be formed, resulting in a high performance semiconductor device with a high drivability.

In a semiconductor device shown in FIG. 22, the outer edge of low concentration impurity region 9A is located coplanar with the surface of the sidewall of gate electrode 6A, while the outer edge of low concentration impurity region 9B extends under gate electrode 6A. In this embodiment, the outer edge of one low concentration impurity region 9A does not extend under gate electrode 6A, parasitic capacitance will not be formed in this portion.

In a semiconductor device shown in FIG. 23, one of the source/drain regions includes a high concentration impurity region 44A and a medium concentration impurity region 44B connected to high concentration impurity region 44A. The other source/drain region includes a high concentration impurity region 45A, a medium concentration impurity region 45B connected to the high concentration impurity region, and a low concentration impurity region 45C connected to medium concentration impurity region 45B. Since an outer edge of medium concentration impurity region 45B does not extend under gate electrode 6A, parasitic capacitance will not be formed in one of the source/drain regions.

Embodiment 5

A method of manufacturing the semiconductor device shown in FIG. 21 will now be described.

Referring to FIG. 24, a field oxide film 4 for isolating an active region from another is formed at a surface of a semiconductor substrate 1. A thin film portion 5A and a pair of thick film portions 5C sandwiching thin film portion 5A therebetween are formed on the active region.

Figure 25:
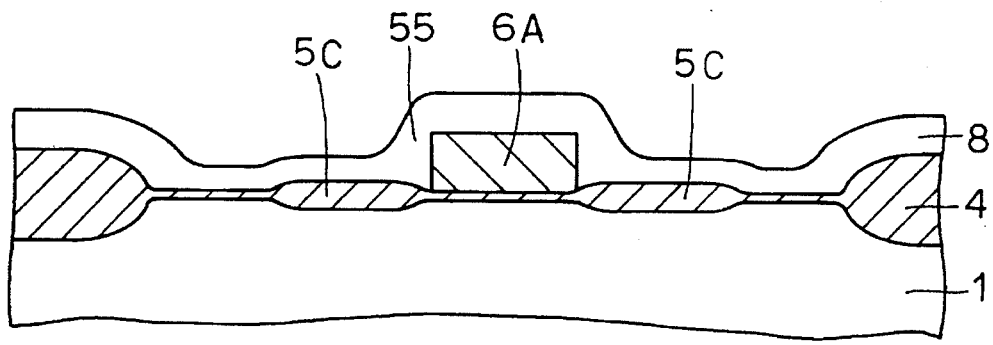

Referring to FIG. 25, gate electrode 6A is formed on thin film portion 5A. An oxide film 8 is formed on semiconductor substrate 1 by CVD so as to cover gate electrode 6A.

Figure 26:
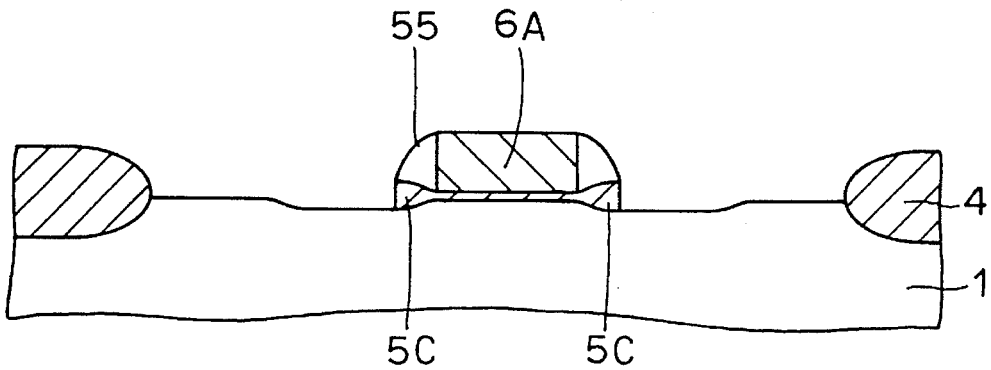

Referring to FIG. 26, oxide film 8 and thick film portions 5C are etched by anisotropic etching such that sidewall spacers 55 are formed on both sidewalls of gate electrode 6 and a surface of semiconductor substrate 1 is exposed.

Figure 27:
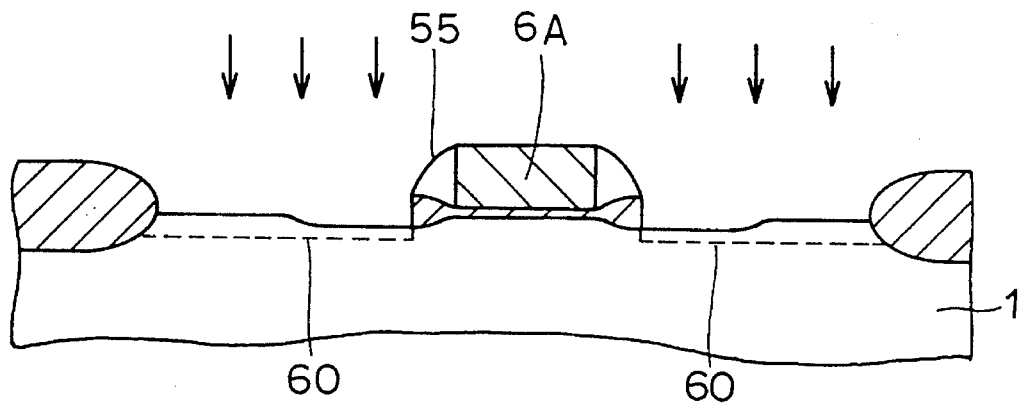

Referring to FIG. 27, an implanted layer 60 which serves as a base of the high concentration impurity region of the source/drain region is formed.

Figure 28:
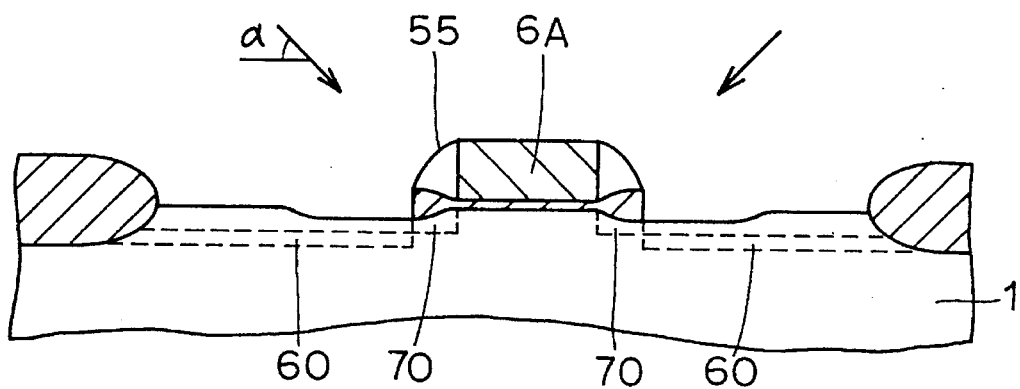

Referring to FIG. 28, by performing oblique rotary ion implantation, an implanted layer 70 which will later be the low concentration impurity region of the source/drain region is formed. The implantation angle $\alpha$ is in the range of 30°–45°.

Figure 29:
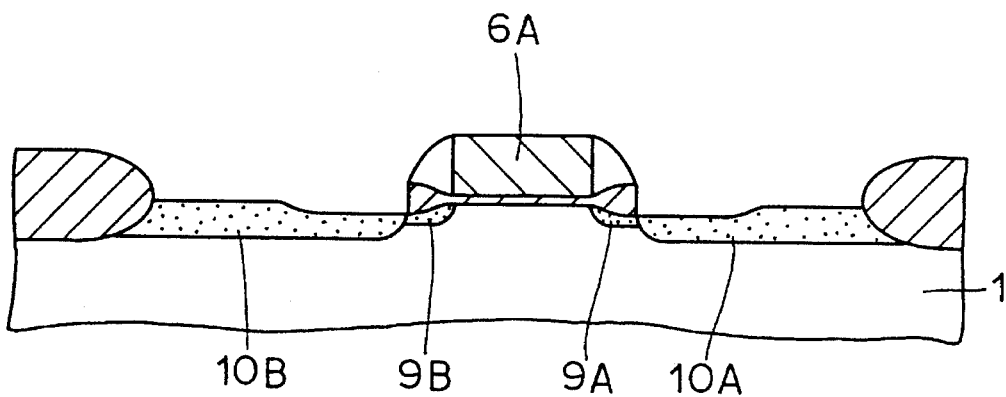
Figure 30:
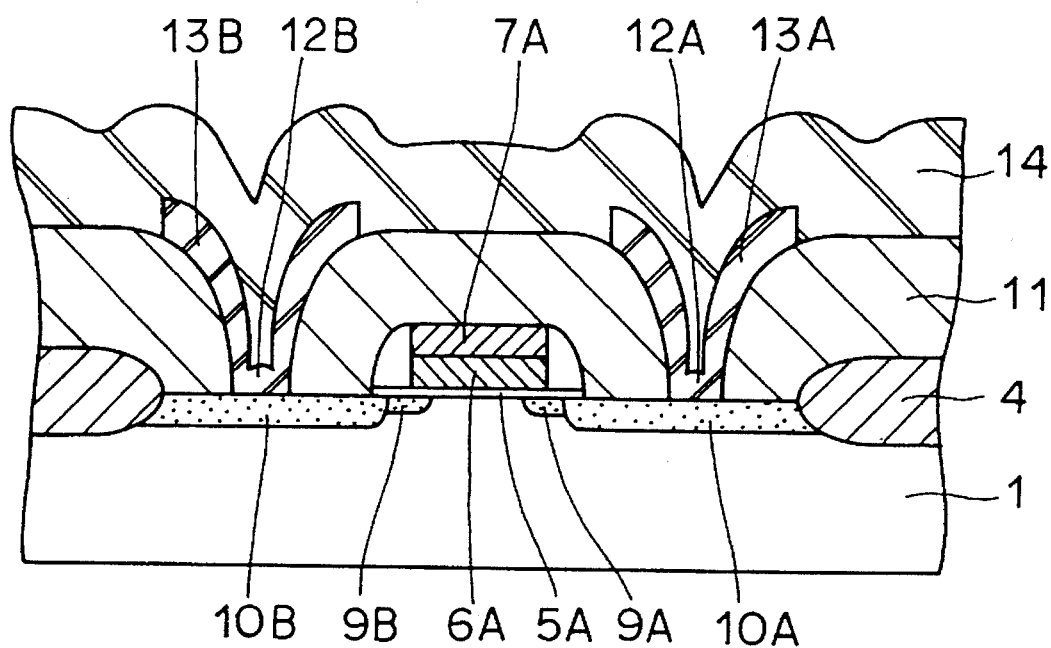
FIG. 30 is a sectional view of a conventional semiconductor device.
Figure 31:
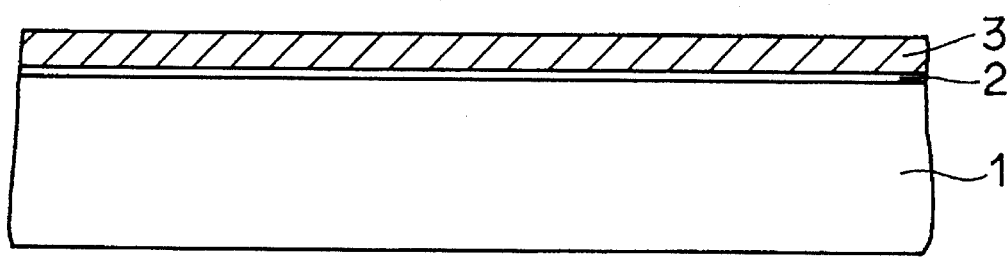
FIGS. 31–41 are partial sectional views of the semiconductor device showing first to eleventh steps of a method of manufacturing the conventional semiconductor device.
Figure 32:
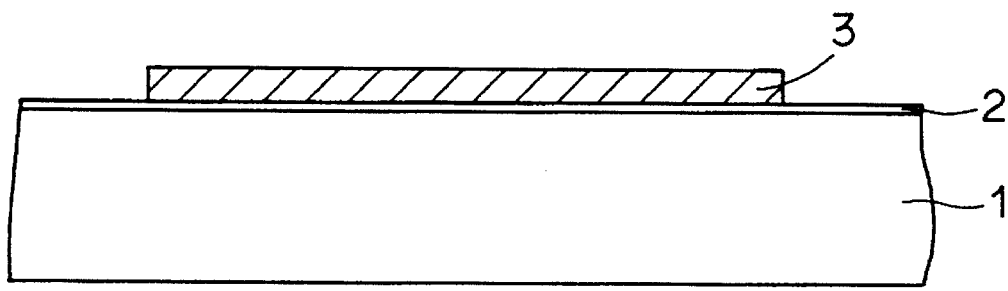
Figure 33:
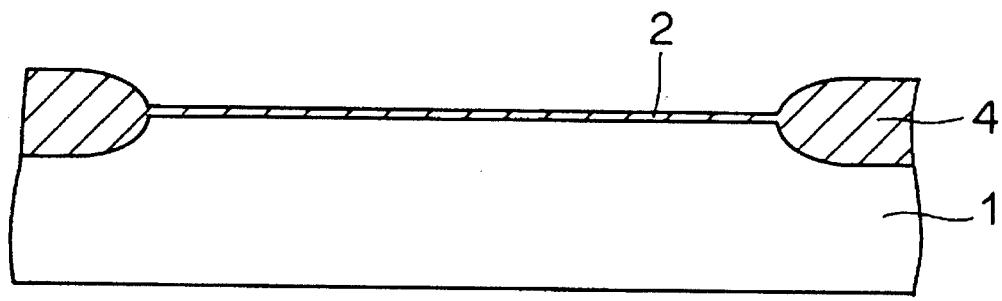
Figure 34:
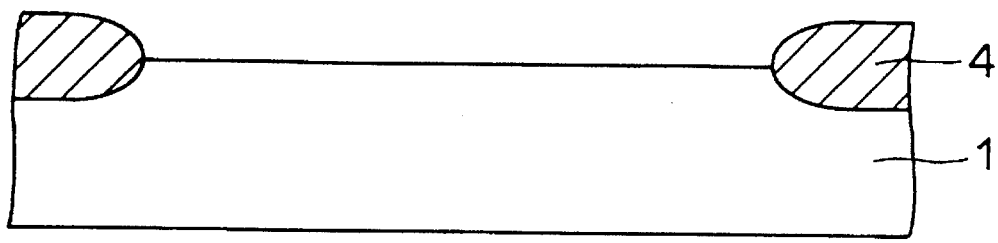
Figure 35:
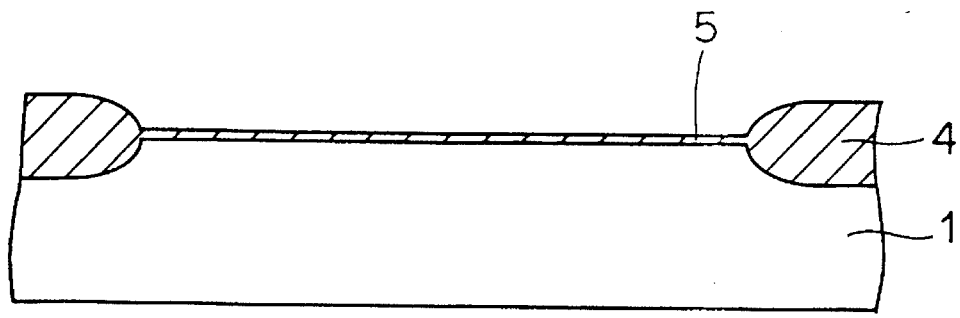
Figure 36:
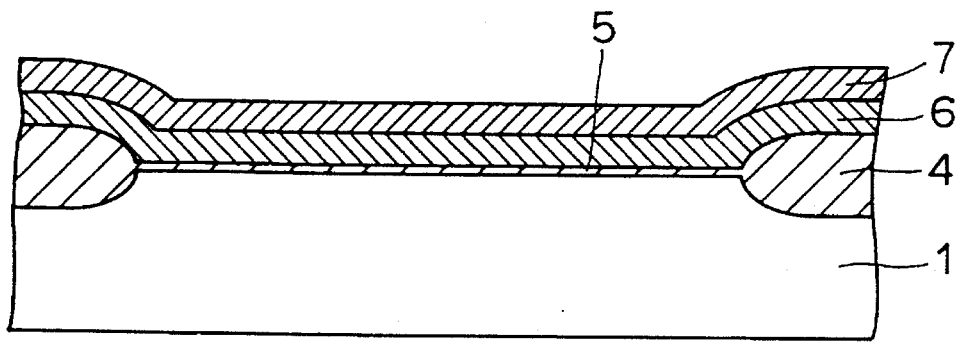
Figure 37:
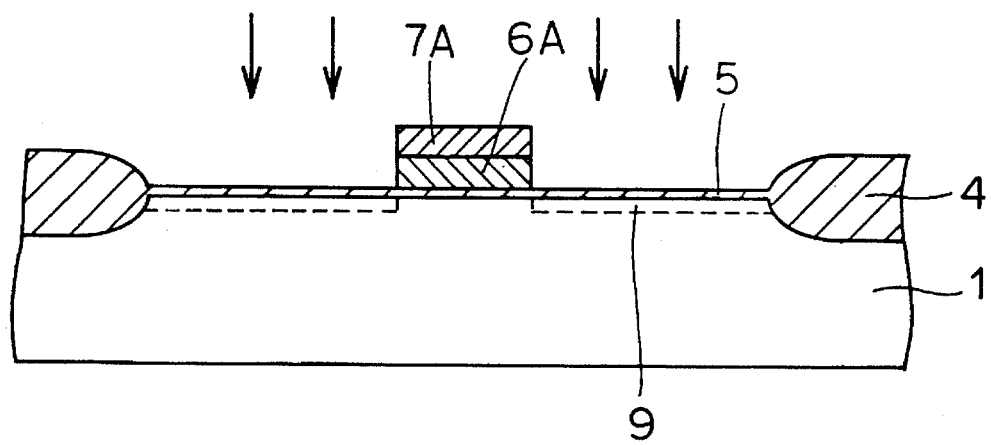
Figure 38:
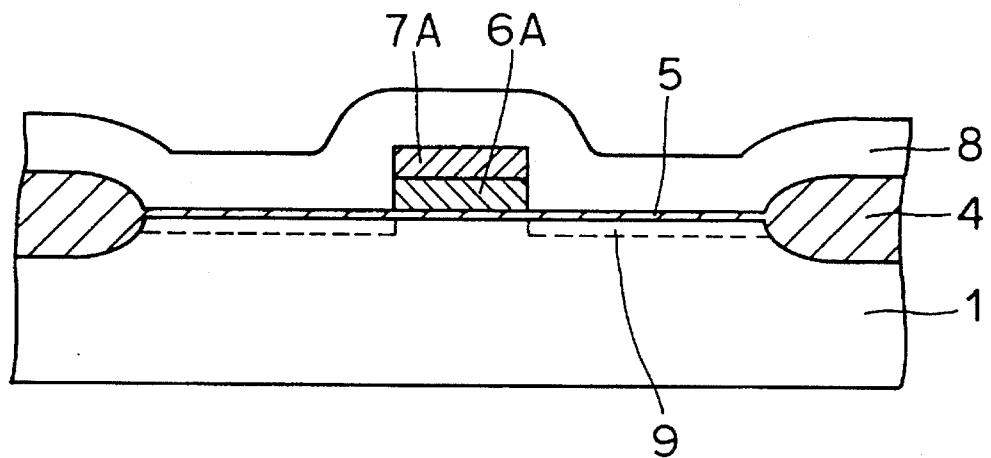
Figure 39:
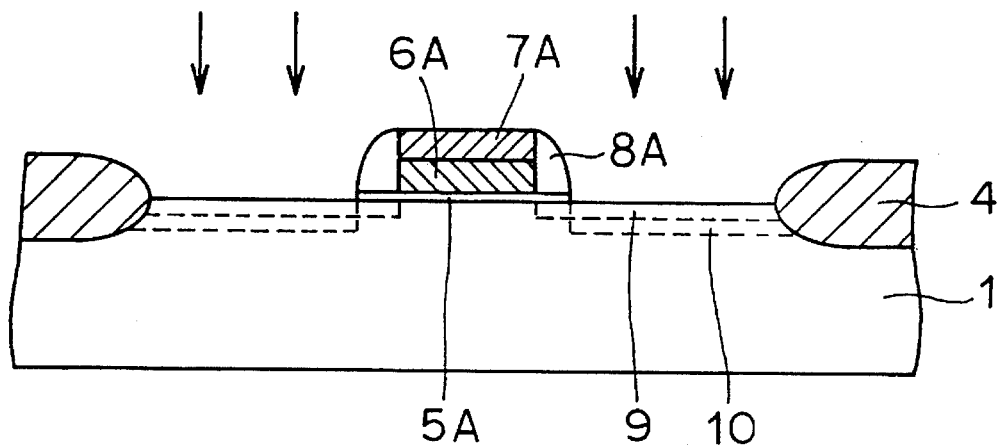
Figure 40:
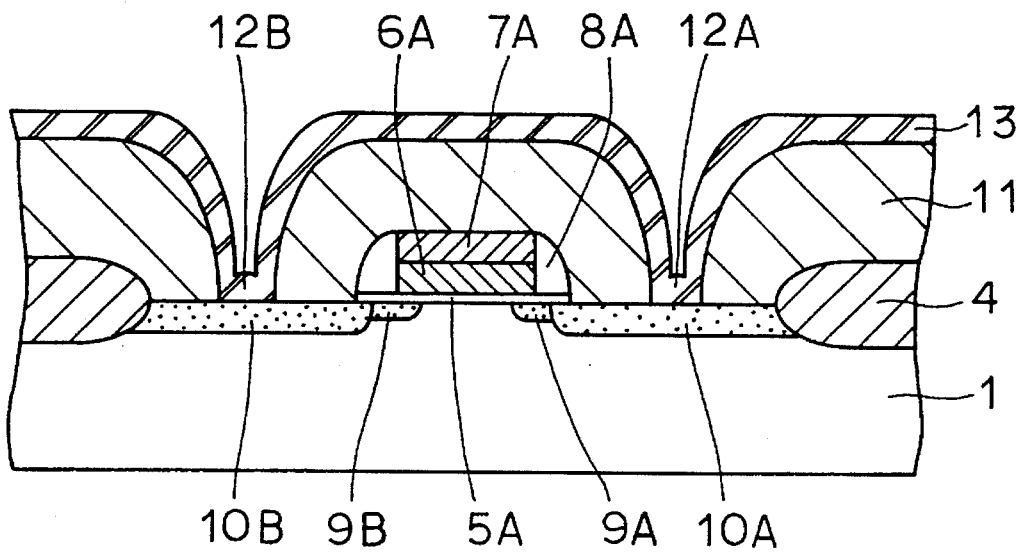
Figure 42:
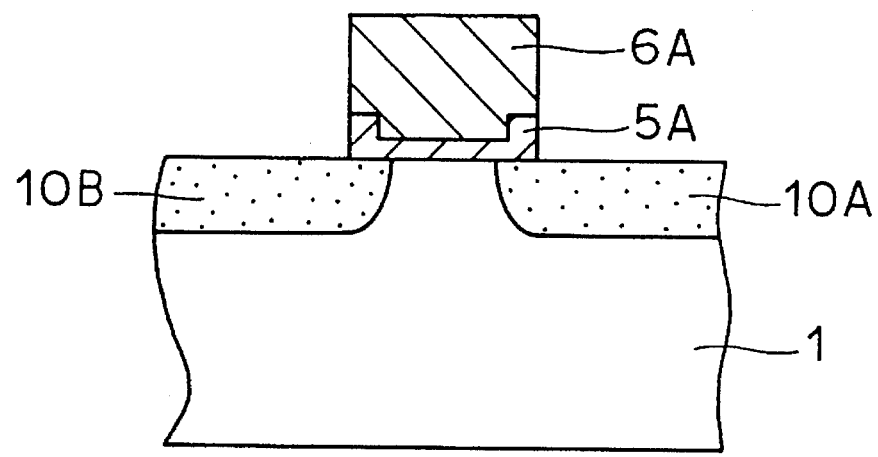
FIG. 42 is a sectional view of another conventional semiconductor device.
Figure 43:
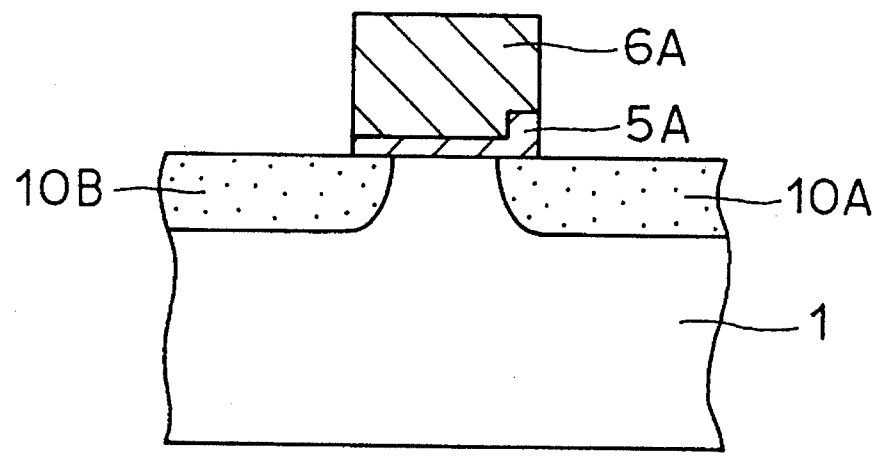
FIG. 43 is a sectional view of still another conventional semiconductor device.
Figure 41:
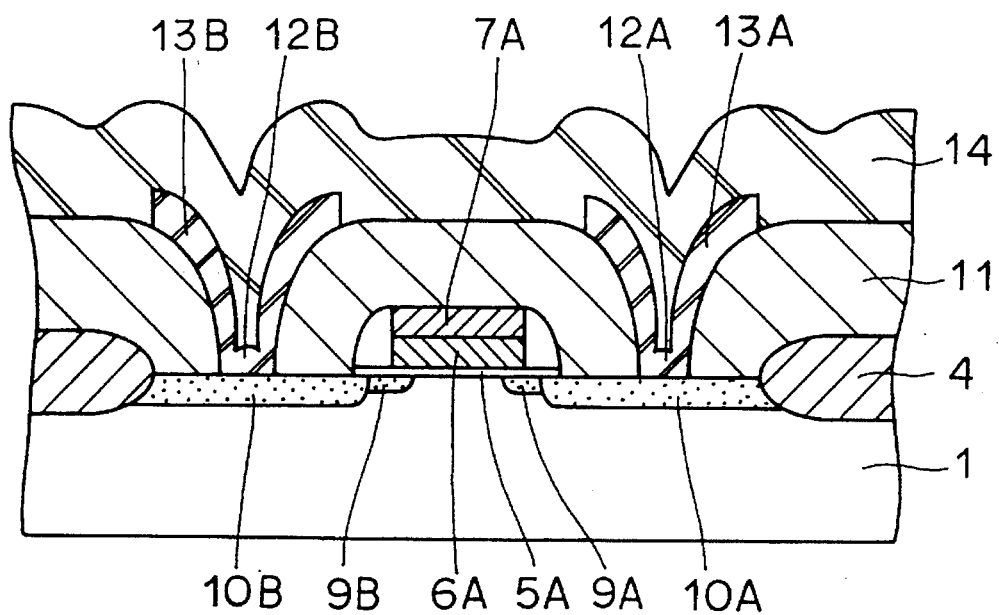

Referring to FIG. 29, by performing thermal diffusion of implanted impurities, the source/drain region of the LDD structure having low concentration impurity region 9A, 9B and high concentration impurity region 10A, 10B is formed. If the implantation angle $\alpha$ is selected to be in the range of 30°–45°, end portions of low concentration impurity regions 9A and 9B will be located coplanar with the sidewalls of gate electrode 6A, respectively.

As described above, in the semiconductor device in accordance with one aspect of the present invention, since an outer edge of the common drain region does not extend under first and second gate electrodes, parasitic capacitance will not be formed, resulting in a semiconductor device with small gate overlap capacitance.

In the semiconductor device in accordance with another aspect of the present invention, since an outer edge of at least one of the pair of source/drain regions does not extend under a gate electrode, parasitic capacitance will not be formed in at least one side of the pair of source/drain regions, resulting in a semiconductor device with small gate overlap capacitance.

In the method of manufacturing the semiconductor device in accordance with a further aspect of the present invention, a low concentration portion of the common drain region is formed by rotary ion implantation. It is also possible to implant ions perpendicular to a substrate. However, the method to implant ions perpendicular to the substrate requires a lithography process. If the rotational ion implantation is used, such a lithography process can be avoided, resulting in the improvement in throughput.

In a method of manufacturing the semiconductor device in accordance with still further aspect of the present invention, since low concentration impurity ions are implanted to the surface of the semiconductor substrate by oblique rotary ion implantation, it is possible to form a low concentration impurity ion region of the source/drain region so as not to overlap the gate electrode by adjusting the implantation angle, resulting in a semiconductor device with small gate overlap capacitance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate;

a first gate electrode and a separate second gate electrode provided on said semiconductor substrate so as to be parallel to each other;

a first gate oxide film provided between said semiconductor substrate and said first gate electrode;

a second gate oxide film provided between said semiconductor substrate and said second gate electrode;

a common drain region provided between said first gate electrode and said second gate electrode in a surface of said semiconductor substrate;

a first source region provided opposite to said common drain region with said first gate electrode therebetween in the surface of said semiconductor substrate; and a second source region provided opposite to said common drain region with said second gate electrode therebetween in the surface of said semiconductor substrate; wherein said common drain region includes a high concentration impurity region extending in a direction of said first and second gate electrodes and a low concentration impurity region provided on each side of the high concentration impurity region, an outer edge of one of said low concentration impurity regions being located coplanar with a side surface of said first gate electrode proximate said common drain region, and an outer edge of the other of said low concentration impurity regions being located coplanar with a side surface of said second gate electrode proximate said common drain region, wherein said first source region includes (a) a first high concentration impurity region provided furthermost from said first gate electrode and extending in a direction of said first gate electrode, (b) a first medium concentration impurity region having lower concentration than said first high concentration impurity region, provided adjacent to said first high concentration impurity region and extending in a direction of said first gate electrode, and (c) a first low concentration impurity region having lower concentration than said first medium concentration impurity region, provided adjacent to said first medium concentration impurity region and nearest to said first gate electrode and extending in a direction of said first gate electrode, an outer edge of said first low concentration impurity region extending under said first gate electrode; and wherein said second source region includes (d) a second high concentration impurity region provided furthermost from said second gate electrode and extending in a direction of said second gate electrode, (e) a second medium concentration impurity region having lower concentration than said second high concentration impurity region, provided adjacent to said second high concentration impurity region and extending in a direction of said second gate electrode, and (f) a second low concentration impurity region having lower concentration than said second medium concentration impurity region, provided adjacent to said second medium concentration impurity region and nearest to said second gate electrode and extending in a direction of said second gate electrode, an outer edge of said second low concentration impurity region extending under said second gate electrode.

* * * * *